(12) United States Patent
Abdulaziz et al.

(10) Patent No.: US 12,032,340 B2
(45) Date of Patent: Jul. 9, 2024

(54) TIME-TO-DIGITAL CONVERTER CIRCUITRY

(71) Applicant: Telefonaktiebolaget LM Ericsson (publ), Stockholm (SE)

(72) Inventors: Mohammed Abdulaziz, Lund (SE); Henrik Sjöland, Lund (SE); Tony Påhlsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 18/236,222

(22) Filed: Aug. 21, 2023

(65) Prior Publication Data

US 2023/0393533 A1 Dec. 7, 2023

Related U.S. Application Data

(63) Continuation of application No. 17/910,437, filed as application No. PCT/EP2020/057190 on Mar. 17, 2020, now Pat. No. 11,868,094.

(51) Int. Cl.
*G04F 10/00* (2006.01)
*H03L 7/081* (2006.01)
*H03L 7/183* (2006.01)

(52) U.S. Cl.
CPC .......... *G04F 10/005* (2013.01); *H03L 7/0818* (2013.01); *H03L 7/183* (2013.01)

(58) Field of Classification Search
CPC ...... G04F 10/005; H03L 7/0818; H03L 7/183
See application file for complete search history.

(56) References Cited

U.S. PATENT DOCUMENTS

| 8,797,203 B2 * | 8/2014 | Lee ...................... G04F 10/005 |
| | | 341/166 |
| 9,479,187 B2 * | 10/2016 | Mayer ................... H04L 5/0048 |
| 9,490,831 B2 | 11/2016 | Kim et al. |

(Continued)

FOREIGN PATENT DOCUMENTS

| EP | 4099052 A1 | 12/2022 |
| WO | 2021185430 A1 | 9/2021 |

(Continued)

OTHER PUBLICATIONS

Ito, Satoshi, et al., "Stochastic TDC Architecture with Self-Calibration", 2010 IEEE Asia Pacific Conference on Circuits and Systems, 2010, 1027-1030.

(Continued)

*Primary Examiner* — Adam D Houston
(74) *Attorney, Agent, or Firm* — Murphy, Bilak & Homiller, PLLC

(57) ABSTRACT

A time-to-digital converter (TDC) circuitry for converting a phase difference between an input reference signal and an input clock signal to a digitally represented output signal. The TDC circuitry comprises multiple constituent TDCs, a reference signal provider, and a digital signal combiner. Each TDC is configured to convert a phase difference between a constituent reference signal and a constituent clock signal to a digitally represented constituent output signal. The reference signal provider is configured to provide the respective constituent reference signals to each of the TDCs. In at least a parallel operation mode of the TDC circuitry, each respective constituent reference signal comprises a respectively delayed version of the input reference signal with different respective delays for at least two of the respective constituent reference signals. The digital signal combiner is configured to provide the digitally represented (Continued)

output signal based on the digitally represented constituent output signals of the TDCs.

19 Claims, 3 Drawing Sheets

(56) References Cited

U.S. PATENT DOCUMENTS

| | | | |
|---|---|---|---|
| 10,666,420 B1 * | 5/2020 | Bogdan | G04F 10/005 |
| 10,965,305 B1 * | 3/2021 | Ramaraju | G04F 10/005 |
| 11,012,083 B1 * | 5/2021 | Waltari | G04F 10/005 |
| 11,067,954 B1 | 7/2021 | Bhaumik et al. | |
| 11,075,642 B2 * | 7/2021 | Shi | H03L 7/085 |
| 11,079,723 B2 | 8/2021 | Chu et al. | |
| 11,320,792 B2 * | 5/2022 | Sudo | G04F 10/005 |
| 11,868,094 B2 * | 1/2024 | Abdulaziz | H03L 7/0818 |
| 11,888,499 B2 * | 1/2024 | Todorokihara | H03M 1/1255 |
| 2009/0072812 A1 * | 3/2009 | Henzler | G04F 10/005 |
| | | | 324/76.82 |
| 2011/0084863 A1 | 4/2011 | Chiu et al. | |
| 2017/0285579 A1 | 10/2017 | Kitazawa et al. | |
| 2022/0278690 A1 | 9/2022 | Shumaker et al. | |
| 2024/0069196 A1 * | 2/2024 | Yu | G01S 7/4817 |

FOREIGN PATENT DOCUMENTS

| | | | |
|---|---|---|---|
| WO | 2021254606 A1 | 12/2021 | |
| WO | 2022128049 A1 | 6/2022 | |

OTHER PUBLICATIONS

Li, Congbing, et al., "Timing Measurement BOST Architecture with Full Digital Circuit and Self-Calibration Using Characteristics Variation Positively for Fine Time Resolution", 2016 IEEE 21st International Mixed-Signal Testing Workshop (IMSTW), 2016, 1-6.

Lu, Ping, et al., "A 3.6 mW, 90 nm CMOS Gated-Vernier Time-to-Digital Converter With an Equivalent Resolution of 3.2 ps", IEEE Journal of Solid-State Circuits, vol. 47, No. 7, Jul. 2012, 1626-1635.

Straayer, Matthew Z., et al., "A Multi-Path Gated Ring Oscillator TDC With First-Order Noise Shaping", IEEE Journal of Solid-State Circuits, vol. 44, No. 4, Apr. 2009, 1089-1098.

Wu, Ying, et al., "A 3.5-6.8-GHz Wide-Bandwidth DTC-Assisted Fractional-N All-Digital PLL With a Mash Δ-TDC for Low In-Band Phase Noise", IEEE Journal of Solid-State Circuits, vol. 52, No. 7, Jul. 2017, 1885-1903.

* cited by examiner

TIME-TO-DIGITAL CONVERTER CIRCUITRY

TECHNICAL FIELD

The present disclosure relates generally to the field of time-to-digital conversion. More particularly, it relates to high-resolution time-to-digital conversion.

BACKGROUND

Various time-to-digital conversion approaches are known in the art. For example, "Stochastic TDC Architecture with Self-Calibration", by Ito, et al., 2010 IEEE Asia Pacific Conference on Circuits and Systems, pp. 1027-1030 describes a time-to-digital converter architecture with fine time resolution, and "Time Measurement BOST Architecture with Full Digital Circuit and Self-Calibration Using Characteristics Variation Positively for Fine Time Resolution", by Li, et al., 2016 IEEE 21st International Mixed-Signal Testing Workshop (IMSTW), describes a time-to-digital architecture to measure the timing difference between single-event two pulses with fine resolution.

Many time-to-digital converters (TDCs) experience one or more of the following problems: that the maximum resolution is lower than desired, that the maximum (time) range is lower than desired, that the power consumption is higher than desired, that the implementation complexity and/or size is higher than desired, that the accuracy is lower than desired, that the noise is higher than desired, and that the non-linearity is higher than desired.

Therefore, there is a need for alternative time-to-digital converters.

SUMMARY

It should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to solve or mitigate, alleviate, or eliminate at least some of the above or other disadvantages.

A first aspect is a time-to-digital converter (TDC) circuitry for converting a phase difference between an input reference signal and an input clock signal to a digitally represented output signal.

The TDC circuitry comprises a plurality of constituent TDCs, wherein each constituent TDC is configured to convert a phase difference between a constituent reference signal and a constituent clock signal to a digitally represented constituent output signal.

The TDC circuitry also comprises a reference signal provider configured to provide the respective constituent reference signals to each of the constituent TDCs, wherein—in at least a parallel operation mode of the TDC circuitry—each respective constituent reference signal comprises a respectively delayed version of the input reference signal with different respective delays for at least two of the respective constituent reference signals.

The TDC circuitry also comprises a digital signal combiner configured to provide the digitally represented output signal based on the digitally represented constituent output signals of the constituent TDCs.

In some embodiments, the digital signal combiner is configured to provide—in at least the parallel operation mode of the TDC circuitry—the digitally represented output signal by one or more of: digital addition of two or more of the digitally represented constituent output signals, calculation of an average value of two or more of the digitally represented constituent output signals, and determination of a median value of two, three, or more of the digitally represented constituent output signals.

In some embodiments, the reference signal provider is configured to provide—in at least the parallel operation mode of the TDC circuitry—the respective constituent reference signals as respectively delayed versions of the input reference signal with the respective delays being stochastically generated.

In some embodiments, the reference signal provider is configured to provide—in at least the parallel operation mode of the TDC circuitry—the respective constituent reference signals as respectively delayed versions of the input reference signal with the respective delays being randomly distributed.

In some embodiments, the reference signal provider is configured to provide—in at least the parallel operation mode of the TDC circuitry—the respective constituent reference signals as respectively delayed versions of the input reference signal with the respective delays being distributed within a range associated with a constituent TDC resolution.

In some embodiments, the reference signal provider is configured to provide—in at least the parallel operation mode of the TDC circuitry—the respective constituent reference signals as respectively delayed versions of the input reference signal with the respective delays being uniformly distributed.

In some embodiments, each constituent TDC comprises a plurality of delay elements arranged in sequence to successively delay the constituent clock signal, and a corresponding plurality of output ports, wherein each output port is configured to—when triggered by the constituent reference signal—provide an output of one of the delay elements as a symbol of the digitally represented constituent output signal.

In some embodiments—in the parallel operation mode of the TDC circuitry, the TDC circuitry is configured to provide the input clock signal as the respective constituent clock signal to each of the constituent TDCs.

In some embodiments, at least some constituent TDCs are configured to provide respectively delayed versions of the input clock signal.

In some embodiments—in a serial operation mode of the TDC circuitry, the TDC circuitry is configured to provide the input clock signal as respective constituent clock signal to one constituent TDC, and to successively provide respectively delayed versions of the input clock signal as respective constituent clock signals to the other constituent TDCs, and the digital signal combiner is configured to provide the digitally represented output signal as a concatenation of the digitally represented constituent output signals of the constituent TDCs.

In some embodiments, the reference signal provider is configured to provide—in the serial operation mode of the TDC circuitry—the same constituent reference signal to all of the constituent TDCs.

In some embodiments—in an intermediate operation mode of the TDC circuitry (wherein each of a plurality of collections of constituent TDCs comprises serially arranged constituent TDCs), the TDC circuitry is configured to provide the input clock signal as the respective constituent clock signal to first constituent TDCs of each collection, and to successively—within each collection—provide respectively delayed versions of the input clock signal as respective constituent clock signal to the constituent TDCs of the collection, and the digital signal combiner is configured to provide the digitally represented output signal based on concatenations of the digitally represented constituent output signals of constituent TDCs in each collection.

In some embodiments, the reference signal provider is configured to provide—in the intermediate operation mode of the TDC circuitry and within each collection—the same constituent reference signal to all constituent TDCs within the collection.

In some embodiments, the TDC circuitry further comprises a mode selection signal input configured to control one or more of: provision of the respective constituent clock signal, provision of the constituent reference signal, and provision of the digitally represented output signal.

A second aspect is a phase locked loop (PLL) comprising the TDC circuitry of the first aspect.

A third aspect is an analog-to-digital converter (ADC) comprising the TDC circuitry of the first aspect.

A fourth aspect is a communication device comprising the TDC circuitry of the first aspect.

A fifth aspect is a method for converting a phase difference between an input reference signal and an input clock signal to a digitally represented output signal. The method comprises providing respective constituent reference signals to each of a plurality of constituent TDCs, wherein—in at least a parallel operation mode—each respective constituent reference signal comprises a respectively delayed version of the input reference signal with different respective delays for at least two of the respective constituent reference signals, converting a phase difference between the respective constituent reference signal and a respective constituent clock signal to a digitally represented constituent output signal for each of the plurality of constituent TDCs, and providing the digitally represented output signal based on the digitally represented constituent output signals of the constituent TDCs using a digital signal combiner.

In some embodiments, any of the above aspects may additionally have features identical with or corresponding to any of the various features as explained above for any of the other aspects.

An advantage of some embodiments is that the maximum resolution may be increased compared to prior art solutions.

An advantage of some embodiments is that the maximum (time) range may be increased compared to prior art solutions.

An advantage of some embodiments is that the power consumption may be decreased compared to prior art solutions.

An advantage of some embodiments is that the implementation complexity and/or size may be decreased compared to prior art solutions.

An advantage of some embodiments is that the accuracy may be increased compared to prior art solutions.

An advantage of some embodiments is that the noise may be decreased compared to prior art solutions.

An advantage of some embodiments is that the non-linearity may be decreased compared to prior art solutions.

Some advantages of some embodiments include: increase of resolution beyond the gate-delay of an applied technology, possibility to used small size inverters which may lead to low power consumption, avoidance of increased line length (compare with Vernier solutions), inherent linearity, a solution that scales well to very high resolution, embrace of random variations which may lead to advantages when the technology scales, and application of parallel TDC lines which may lead to less noise.

Some advantages of some embodiments with multi-mode operation include: flexibility between range and resolution, no need for separate frequency locking loop to achieve locking of a phase locked loop (PLL), and flexibility between phase noise and robustness in a PLL.

An advantage of some embodiments is that two or more of the above advantages may be achieved in combination.

An advantage of some embodiments is that trade-offs between two or more advantages may be less pronounced compared to prior art solutions.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

As already mentioned above, it should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

In the following, embodiments will be described which provide time-to-digital converter (TDC) circuitry.

There is a fundamental trade-off between TDC resolution, linearity and power consumption.

When a required resolution is lower than a shortest possible gate-delay of an applied technology, the trade-off typically gets more severe (e.g., since more complex and/or more power consuming architectures may be applicable).

The TDC circuitries provided herein may, in some embodiments, mitigate these and/or other problems.

Generally, the TDC circuitries of some embodiments presented herein are configured to convert a phase difference between an input reference signal and an input clock signal to a digitally represented output signal. Converting a phase difference between two signals to a digitally represented signal may be seen as time-to-digital conversion as is well understood in the art. One motivation therefore is that a phase difference between two signals may, given a frequency of the two signals, be expressed in terms of a time duration.

Figure 1:
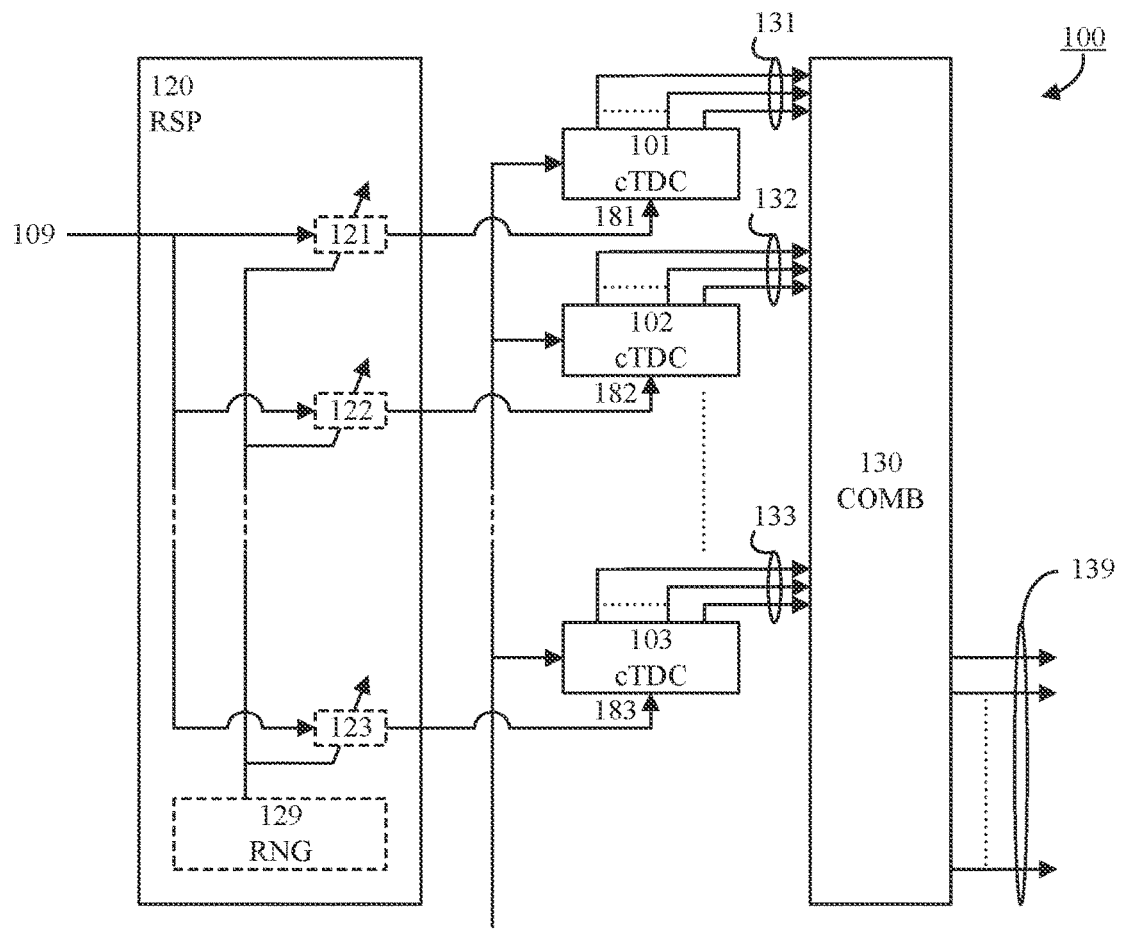
FIG. 1 is a schematic block diagram illustrating an example TDC circuitry according to some embodiments.

FIG. 1 schematically illustrates an example TDC circuitry 100 according to some embodiments. The example TDC circuitry 100 is for converting a phase difference between the input reference signal represented by 109 and an input clock signal represented by 110 to a digitally represented output signal 139.

The TDC circuitry 100 comprises a reference signal provider (RSP) 120, a plurality of constituent TDCs (cTDC) 101, 102, 103, and a digital signal combiner (COMB) 130.

The example TDC circuitry 100 represents a parallel operation mode TDC circuitry, wherein the plurality of constituent TDCs 101, 102, 103 operate in a parallel processing fashion.

The reference signal provider 120 is configured to provide respective constituent reference signals 181, 182, 183 to each of the constituent TDCs 101, 102, 103. Each of the respective constituent reference signals 181, 182, 183 is based on the input reference signal 109.

Each constituent TDC is configured to convert a phase difference between the constituent reference signal 181, 182, 183 and a constituent clock signal to a digitally represented constituent output signal 131, 132, 133. In this embodiment, the input clock signal 110 is used directly as constituent clock signal for each of the constituent TDCs 101, 102, 103.

The digital signal combiner 130 is configured to provide the digitally represented output signal 139 based on the digitally represented constituent output signals 131, 132, 133 of the constituent TDCs.

In the example TDC circuitry 100, each respective constituent reference signal comprises a respectively delayed version of the input reference signal 109, with different respective delays for at least two of the respective constituent reference signals. The delay of the input reference signal 109 may be achieved by the reference signal provider 120 having delay elements 121, 122, 123 providing a respective delay for each of the constituent TDCs 101, 102, 103.

The delay elements 121, 122, 123 may be variably controllable as illustrated in FIG. 1. The control may be exercised by a controller (e.g., controlling circuitry or a control module) comprised in, or otherwise associated with (e.g., connectable, or connected, to) the reference signal provider 120.

In some embodiments, the respective delays are stochastically generated and/or randomly distributed. For example, the respective delays may be provided according to any suitable random, or pseudo-random, value generation algorithm. The provision of the respective delays may, for example, be implemented by a random number generator (RNG) 129—an exemplification of a controller of the delay elements 121, 122, 123.

Whether or not the respective delays are stochastically generated and/or randomly distributed, the respective delays 121, 122, 123 may be distributed within a range associated with a constituent TDC resolution. For example, the range associated with the constituent TDC resolution may be based on (e.g., equal to, substantially equal to, or slightly exceeding) the (average) delay of one delay element of a constituent TDC; which delay elements will be exemplified further in connection to FIG. 2, and should not be confused with the delay elements 121, 122, 123 of the reference signal provider.

Whether or not the respective delays are stochastically generated and/or randomly distributed, the respective delays 121, 122, 123 may be uniformly distributed within a distribution range (which may, or may not, be associated with the constituent TDC resolution), according to some embodiments. Non-uniform distributions may be applied in other embodiments.

In the example TDC circuitry 100, the digital signal combiner 130 is configured to provide the digitally represented output signal 139 based directly on the digitally represented constituent output signals 131, 132, 133 of each of the constituent TDCs. For example, the digitally represented output signal 139 may be provided as a digital addition of two or more (typically all) of the digitally represented constituent output signals 131, 132, 133, as an average value of two or more (typically all) of the digitally represented constituent output signals 131, 132, 133, or as a median value of two, three, or more (typically all) of the digitally represented constituent output signals 131, 132, 133.

Each of the constituent TDCs 101, 102, 103 can be implemented according to any suitable TDC approach.

Figure 2:
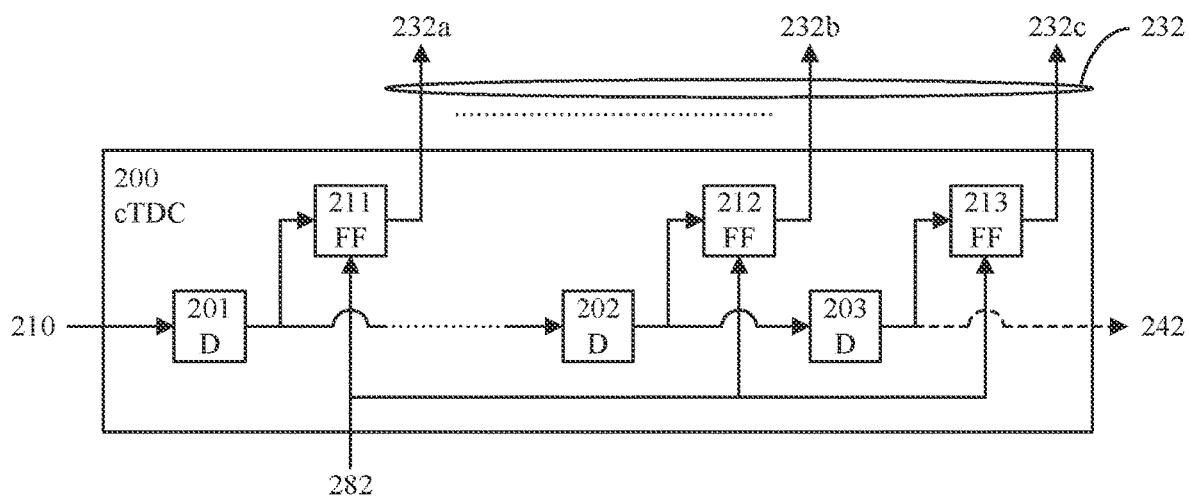
FIG. 2 is a schematic block diagram illustrating an example constituent TDC according to some embodiments.

FIG. 2 schematically illustrates an example constituent TDC (cTDC) 200 according to some embodiments. The example cTDC 200 of FIG. 2 may be used as one or more of the constituent TDCs 101, 102, 103 of FIG. 1 and/or as one or more of the constituent TDCs 301, . . . , 308 of FIG. 3 (which will be described later herein).

Figure 3:
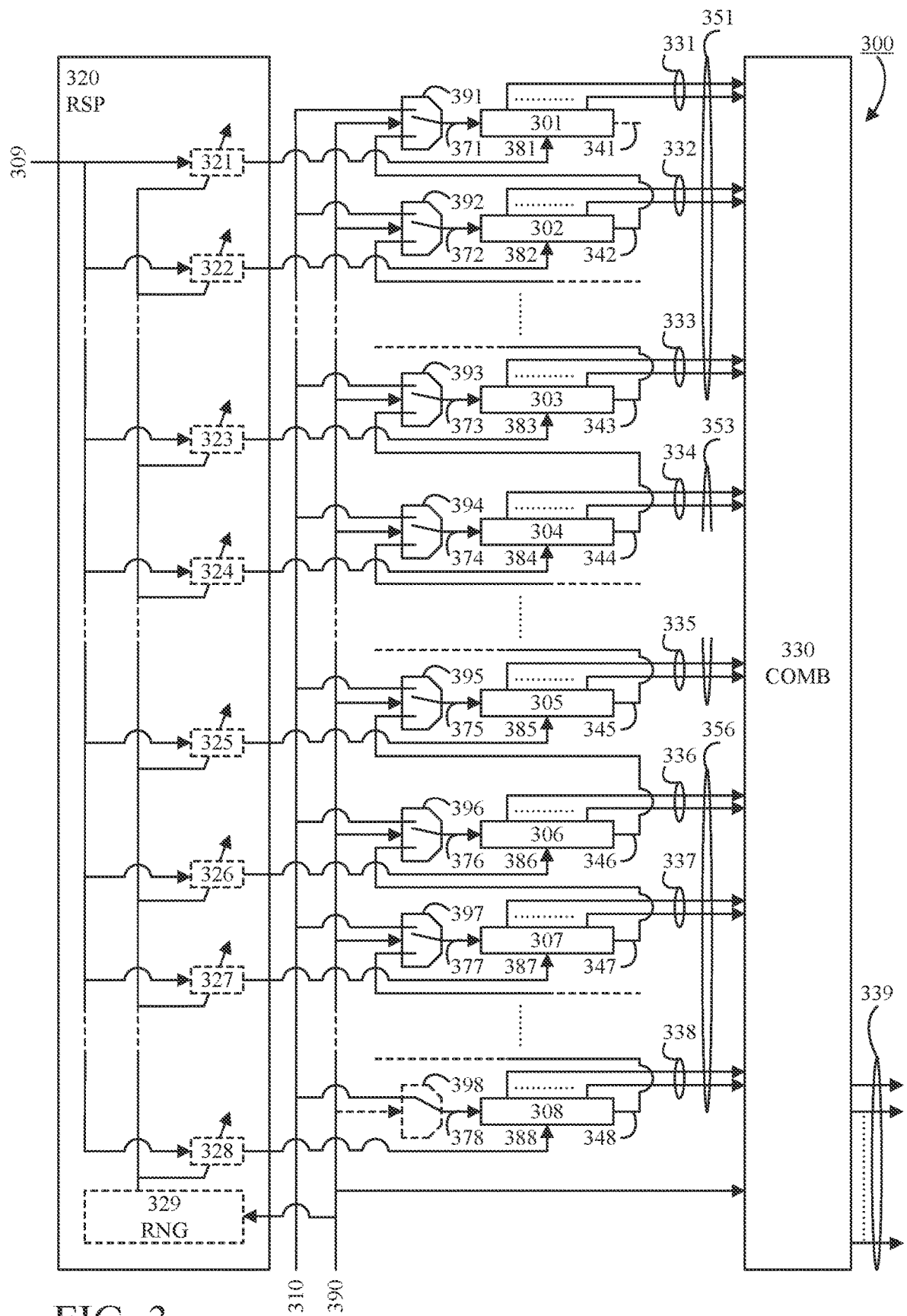
FIG. 3 is a schematic block diagram illustrating an example TDC circuitry according to some embodiments.

The constituent TDC 200 comprises a plurality of delay elements (D; e.g., implemented using inverters) 201, 202, 203 arranged in sequence to successively delay a constituent clock signal 210 (compare with 110 of FIG. 1 and 371, . . . , 378 of FIG. 3).

The constituent TDC 200 also comprises a corresponding plurality of output ports, wherein each output port is configured to—when triggered by a constituent reference signal 282 (compare with 181, 182, 183 or FIGS. 1 and 381, . . . , 388 of FIG. 3)—provide an output of one of the delay elements 201, 202, 203 as a symbol (e.g., a bit) 232a, 232b, 232c of the digitally represented constituent output signal 232 (compare with 131, 132, 133 of FIG. 1 and 331, . . . , 338 of FIG. 3).

In the example constituent TDC 200, each output port is implemented using a (digital) flip-flop circuit (FF) 211, 212, 213 having an output of a respective delay element 201, 202, 203 as input and being triggered (clocked) by the constituent reference signal 282 to output the respective symbol 232a, 232b, 232c.

Thus, in some embodiments, the constituent clock signal (CKV; e.g., a variable clock) is fed to the delay line comprising the plurality of delay elements, and the delay line state is sampled (e.g., by digital flip-flops) at an edge of the constituent reference signal (REF). The time difference between CKV and REF is thereby converted into the sampled state as quantized by the delay elements.

In some embodiments, the example constituent TDC 200 is also configured to provide a delayed version 242 of the constituent clock signal 210. This may, for example, be achieved by using the output of the last delay element 203 (either directly as illustrated in FIG. 2, or by using a buffer).

Generally, all of the plurality of constituent TDCs of a TDC circuitry (e.g., 101, 102, 103 of FIGS. 1 and/or 301, ..., 308 of FIG. 3) may be identical. Alternatively or additionally, one or more of the constituent TDCs of a TDC circuitry may differ in one or more aspects from other constituent TDCs of a TDC circuitry. Differences between constituent TDCs may, for example, be different length (e.g., different number of delay elements 201, 202, 203 and corresponding output ports) and/or different delay duration for each of the delay elements 201, 202, 203.

FIG. 3 schematically illustrates an example TDC circuitry 300 according to some embodiments. The example TDC circuitry 300 is for converting a phase difference between the input reference signal represented by 309 and an input clock signal represented by 310 to a digitally represented output signal 339.

The TDC circuitry 300 comprises a reference signal provider (RSP) 320, a plurality of constituent TDCs (cTDC) 301, 302, 303, 304, 305, 306, 307, 308 and a digital signal combiner (COMB) 330.

The example TDC circuitry 300 represents a TDC circuitry configured for switching between a parallel operation mode and at least one of a serial operation mode and one or more intermediate operation modes.

Switching between the different operation modes may be accomplished by a mode selection signal input 390, for example. In some embodiments, the mode selection signal input may be configured to receive any of two alternative inputs (e.g., in the form of a bit having a value of either zero or one); e.g., when the example TDC circuitry 300 is configured for switching between two operation modes. In some embodiments, the mode selection signal input may be configured to receive any of a more than two (e.g., three, four, etc.) alternative inputs; e.g., when the example TDC circuitry 300 is configured for switching between more than two operation modes. For example, when the example TDC circuitry 300 is configured for switching between three operation modes, the mode selection signal input may be configured to receive any of three alternative inputs (e.g., in the form of two bits having a value of either 00, 01, or 10-11 being unused), and when the example TDC circuitry 300 is configured for switching between four operation modes, the mode selection signal input may be configured to receive any of four alternative inputs (e.g., in the form of two bits having a value of either 00, 01, 10, or 11), etc.

In the parallel operation mode, the plurality of constituent TDCs 301, ..., 308 operate in a parallel processing fashion (compare with FIG. 1). In this operation mode, a maximum resolution may be achieved.

In the serial operation mode, the plurality of constituent TDCs 301, ..., 308 operate in a serial processing fashion, wherein all of the constituent TDCs are successively connected to each other such that a delayed version (compare with 242 of FIG. 2) of the constituent clock signal (compare with 210 of FIG. 2) of a first constituent TDC is used as the constituent clock signal for a second constituent TDC, a delayed version of the constituent clock signal of the second constituent TDC is used as the constituent clock signal for a third constituent TDC, and so on. In this operation mode, a maximum range may be achieved (which may be useful, e.g., for a frequency acquisition procedure of a phase locked loop, PLL).

In an intermediate operation mode, the plurality of constituent TDCs 301, ..., 308 are grouped into a plurality of (non-overlapping) collections of constituent TDCs. Within each collection, the constituent TDCs operate in a serial processing fashion as described above, while the plurality of collections of constituent TDCs operate in a parallel processing fashion. In this operation mode, a medium resolution and a medium range may be achieved.

In the following, embodiments will be described with one intermediate operation mode. However, this is not intended as limiting. Contrarily, two or more intermediate operation modes may be applicable according to some embodiments. Different intermediate operation modes may apply different grouping. For example, one intermediate operation mode may have two collections of constituent TDCs, and other intermediate operation modes may have more than two (e.g., three, four, ..., eight, ..., etc.) collections of constituent TDCs.

The reference signal provider 320 is configured to provide respective constituent reference signals 381, 382, 383, 384, 385, 386, 387, 388 to each of the constituent TDCs 301, ..., 308.

Each of the respective constituent reference signals 381, ..., 388 is based on the input reference signal 309.

Each constituent TDC is configured to convert a phase difference between the constituent reference signal 381, ..., 388 and a constituent clock signal 371, 372, 373, 374, 375, 376, 377, 378 to a digitally represented constituent output signal 331, 332, 333, 334, 335, 336, 337, 338.

In this embodiment, the constituent clock signal 371, ..., 378 for each of the constituent TDCs is either the input clock signal 310 used directly or a respectively delayed version 341, 342, 343, 344, 345, 346, 347, 348 (compare with 242 of FIG. 2) of the constituent clock signal 371, ..., 378 from another constituent TDC. Selection of the constituent clock signal 371, ..., 378 for a constituent TDC, between the input clock signal 310 and a delayed version thereof 341, ..., 348 is implemented using respective switching circuitry 391, 392, 393, 394, 395, 396, 397, 398.

The digital signal combiner 330 is configured to provide the digitally represented output signal 339 based on the digitally represented constituent output signals 331, ..., 333 of the constituent TDCs.

In the parallel operation mode, each respective constituent reference signal 381, ..., 388 comprises a respectively delayed version of the input reference signal 309, with different respective delays for at least two of the respective constituent reference signals. The delay of the input reference signal 309 may be achieved by the reference signal provider 320 having delay elements 321, 322, 323, 324, 325, 326, 327, 328 providing a respective delay for each of the constituent TDCs 301, ... 308.

The delay elements 321, ..., 328 may be variably controllable as illustrated in FIG. 3. The control may be exercised by a controller (e.g., controlling circuitry or a control module) comprised in, or otherwise associated with (e.g., connectable, or connected, to) the reference signal provider 320. For example, the provision of the respective delays may, for example, be implemented by a random number generator (RNG) 329.

As mentioned above, the respective delays may be stochastically generated and/or randomly distributed, and/or distributed within a range associated with a constituent TDC resolution, and/or uniformly or non-uniformly distributed within a distribution range.

In the parallel operation mode, the constituent clock signal 371, ..., 378 for each of the constituent TDCs is the input clock signal 310 used directly. Thus, the mode selection signal input 390 may cause all of the respective switching circuitries 391, ..., 398 to convey the input clock signal 310 (upper switch position according to FIG. 3).

In the parallel operation mode, the digital signal combiner 330 is configured to provide the digitally represented output signal 339 based directly on the digitally represented constituent output signals 331, ..., 338 of each of the constituent TDCs. For example, the digitally represented output signal 339 may be provided as a digital addition of two or more (typically all) of the digitally represented constituent output signals 331, ..., 338, as an average value of two or more (typically all) of the digitally represented constituent output signals 331, ..., 338, or as a median value of two, three, or more (typically all) of the digitally represented constituent output signals 331, ..., 338.

In this operation mode, the cTDCs operate in parallel, and interleaving is used to provide high resolution.

In the serial operation mode, each respective constituent reference signal 381, ..., 388 may comprise a respectively delayed version of the input reference signal 309, with different respective delays for at least two of the respective constituent reference signals, as in the parallel operation mode. Alternatively, the same constituent reference signal 381, ..., 388 (e.g., the input reference signal 309, or an equally delayed version thereof) may be provided to all of the constituent TDCs.

In the serial operation mode, the input clock signal 310 is provided directly as respective constituent clock signal 378 to one constituent TDC 308, and respectively delayed versions 348, ..., 342 of the input clock signal are successively provided as respective constituent clock signals 377, ..., 371 to the other constituent TDCs 307, ..., 301. Thus, the mode selection signal input 390 may cause the respective switching circuitry 398 to convey the input clock signal 310 (upper switch position according to FIG. 3), and all of the other respective switching circuitries 391, ..., 397 to convey the respectively delayed versions 348, 342 of the input clock signal (lower switch position according to FIG. 3).

In the serial operation mode, the digital signal combiner 330 is configured to provide the digitally represented output signal 339 as a concatenation of the digitally represented constituent output signals 331, ..., 338 of the constituent TDCs.

In this operation mode, there is no cTDC parallelization (and no interleaving will take place to provide high resolution). Instead, high range is achieved due to the long chain of cTDCs.

In the intermediate operation mode, each respective constituent reference signal 381, ..., 388 may comprise a respectively delayed version of the input reference signal 309, with different respective delays for at least two of the respective constituent reference signals, as in the parallel operation mode.

For example, at least two of the respective constituent reference signals within a (e.g., each) collection of constituent TDCs may have different respective delays, as in the parallel operation mode. Alternatively, the same constituent reference signal (e.g., the input reference signal 309, or an equally delayed version thereof) may be provided to all of the constituent TDCs within a (e.g., each) collection of constituent TDCs, wherein the constituent reference signal may, or may not, differ between collections.

In the intermediate operation mode, the input clock signal 310 is provided directly as respective constituent clock signal 378, 375, 373 to one (first) constituent TDC 308, 305, 303 of each collection, and respectively delayed versions 348, 347; 345; 343, 342 of the input clock signal are successively provided within each collection as respective constituent clock signals 377, 376; 374; 372, 371 to the other constituent TDCs 307, 306; 304; 302, 301. Thus, the mode selection signal input 390 may cause the respective switching circuitries 398, 395, 393 to convey the input clock signal 310 (upper switch position according to FIG. 3), and all of the other respective switching circuitries 397, 396; 394; 392, 391 to convey the respectively delayed versions 348, 347; 345; 343, 342 of the input clock signal (lower switch position according to FIG. 3).

In the intermediate operation mode, the digital signal combiner 330 is configured to provide the digitally represented output signal 339 based on concatenations 351, 353, 356 of the digitally represented constituent output signals 331, ..., 338, wherein each concatenation 351, 353, 356 is for a corresponding collection of constituent TDCs. For example, the digitally represented output signal 339 may be provided as a digital addition of two or more (typically all) of the digitally represented signal values of concatenations 351, 353, 356 of the digitally represented constituent output signals 331, ..., 338, as an average value of two or more (typically all) of the digitally represented signal values of concatenations 351, 353, 356 of the digitally represented constituent output signals 331, ..., 338, or as a median value of two, three, or more (typically all) of the digitally represented signal values of concatenations 351, 353, 356 of the digitally represented constituent output signals 331, ..., 338. The mode selection signal input 390 may be configured to receive a control signal specifying the operation mode (parallel operation mode or other operation mode, wherein the other operation mode is one or more of serial operation mode and one or more intermediate operation mode). Thus, the control signal may have two allowed values (e.g., parallel/serial or parallel/intermediate), three allowed values (e.g., parallel/intermediate/serial or parallel/first intermediate/second intermediate), or more than three allowed values (e.g., parallel/two or more intermediate/serial or parallel/three or more intermediate).

Based on the operation mode indicated by the control signal, the mode selection signal input 390 may cause the reference signal provider 320 to provide the constituent reference signal according to the above description, and/or cause the switching circuitries 391, ..., 398 to provide the respective constituent clock signal according to the above description, and/or cause the digital signal combiner 330 to provide the digitally represented output signal according to the above description.

According to various embodiments, some of the switching circuitries 391, ..., 398 and/or some of the respectively delayed version outputs 341, 342, 343, 344, 345, 346, 347, 348 may be omitted, depending on whether or not they are necessary for any of the operation modes of the embodiment under consideration. For example, in the example described for FIG. 3, the switching circuitry 398 and the respectively delayed version outputs 341 are not used in any of the operation modes, and may therefore be omitted. When omitted, the switching circuitry (e.g., 398) may be replaced by an equivalent delay according to some embodiments.

Generally, the digitally represented signal value (e.g., 131, 132, 133; 331, ..., 338; 351, 353, 356) may represent the position of change in signal polarity. This may be particularly applicable for the longer delay lines (e.g., serial and possibly some intermediate operational modes), where multiple transitions can occur within the same delay line and counting the number of ones is typically not a viable approach. For short delay lines (e.g., parallel and possibly some intermediate operational modes) however, counting the number of ones may be a beneficial approach to eliminate problems with non-distinct transitions (so called bubbles).

The TDC circuitry of some embodiments may be used in any applications where a TDC is suitable. For example, the TDC circuitry disclosed herein may be used for one or more of: an analog-to-digital converter (ADC), a phase locked loop (PLL), a communication transmitter, a communication receiver, a communication device, a range finder, a RADAR equipment, a LIDAR equipment, and an equipment for determining collision times in a particle collider.

The TDC circuitry of some embodiments may be particularly beneficial when a high resolution, without unnecessary increase of power consumption and/or chip area and/or complexity, is desired.

Figure 4:
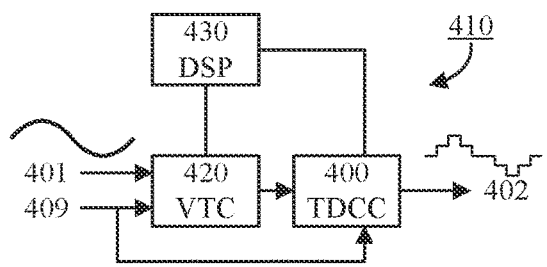
FIG. 4 is a schematic block diagram illustrating an example analog-to-digital converter (ADC) according to some embodiments.

FIG. 4 schematically illustrates an example analog-to-digital converter (ADC) 410 according to some embodiments. The ADC 410 has an input port 401 for the analog signal to be converted and an input port 409 for a reference signal (compare with the 109 of FIG. 1 and 309 of FIG. 3). The signal to be converted and the reference signal are input to a voltage-to-time converter (VTC) 420 and the output therefrom is a clock signal delayed with respect to the reference signal (with a delay depending on, e.g., proportional to, the input signal voltage). This signal (which corresponds to the input clock signal 110, 310 of FIGS. 1 and 3) is input to a time-to-digital converter circuitry (TDCC) 400, which may be any or the TDC circuitries described herein (e.g., any of the TDC circuitries 100 of FIG. 1 and 300 of FIG. 3). The TDCC measures the time difference between the reference signal and the signal delayed by the VTC. The TDCC thereby provides a digitized version of the signal to be converted (corresponding to the digitally represented output signal 139, 339 of FIGS. 1 and 3) via an output port 402. A digital signal processor (DSP) 430 controls the VTC 420 and the TDCC 400.

Figure 5:
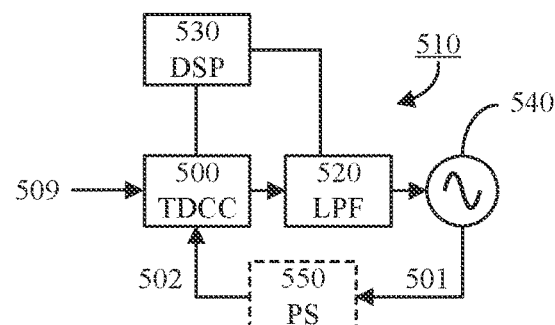
FIG. 5 is a schematic block diagram illustrating an example phase locked loop (PLL) according to some embodiments.

FIG. 5 schematically illustrates an example phase locked loop (PLL) 510 according to some embodiments. The PLL 510 has an input port 509 for a reference signal (compare with the 109 of FIG. 1 and 309 of FIG. 3). The reference signal is input to a time-to-digital converter circuitry (TDCC) 500, which may be any or the TDC circuitries described herein (e.g., any of the TDC circuitries 100 of FIG. 1 and 300 of FIG. 3). The TDCC also receives a feedback signal 502 (which corresponds to the input clock signal 110, 310 of FIGS. 1 and 3). In response to the phase difference between the input signals, the TDCC provides a digital signal (corresponding to the digitally represented output signal 139, 339 of FIGS. 1 and 3) via an output port, which signal is passed through a low-pass filter (LPF) 520. The output of the low-pass filer is used to control an oscillator 540 producing a signal 501 for feedback. The signal 501 for feedback may be provided as the feedback signal 502 to the TDCC. Optionally, the signal 501 for feedback is passed through a pre-scaler (PS) 550 before being provided as the feedback signal 502 to the TDCC. Particularly, the pre-scaler 550 may be useful when the frequency of the oscillator is higher than the maximum frequency that the TDCC can handle with high performance. A digital signal processor (DSP) 530 controls the TDCC 500 and the low-pass filter 520.

Digital phase locked loops (DPLLs) may—due to CMOS technology scaling—achieve similar performance as their analog counterparts. A DPLL typically comprises a time-to-digital converter (TDC), which converts the phase difference between the reference signal (REF) and the digitally controlled oscillator (DCO) variable clock output (CKV) into a digital representation. The in-band phase noise of the DPLL is dependent on the resolution of the TDC and the spur level is dependent on TDC linearity.

The TDC requirements on resolution and range typically lead to a trade-off between power consumption and noise, for example, if a TDC such as that of FIG. 2 is used. A high resolution TDC typically needs a large number of delay cells (compare with 201, 202, 203) with a small delay for each cell to satisfy the range requirement, which requires high power consumption.

Furthermore, the TDC detection range typically needs to cover at least one clock cycle of the feedback signal. To limit power consumption of the TDC it is common to avoid that the TDC range exceeds this one clock cycle by more than a very slight amount. One consequence of this is that a DPLL often has a limited range where it can observe the signal, and may therefore need some additional approach to be able to lock reliably.

Typically, there is also a minimum delay per cell for a given technology. Achieving a higher resolution than given by the minimum delay may require more complex (and more power consuming) architectures like a Vernier structure.

Figure 6:
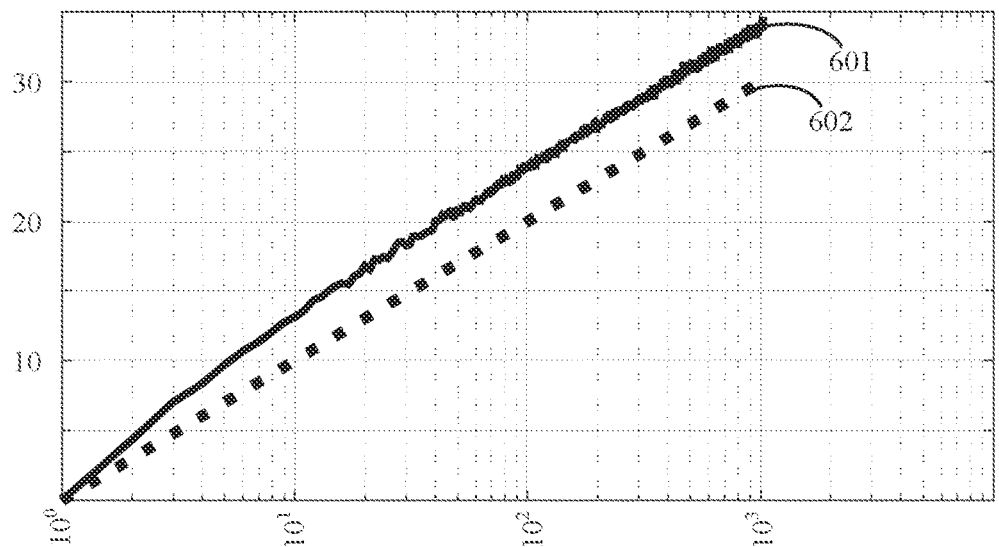
FIG. 6 is a simulation plot illustrating example results achievable by application of some embodiments.

FIG. 6 is a simulation plot illustrating example results achievable by application of some embodiments. The plot illustrates a simulation of effective resolution improvement versus number of parallel delay lines (represented by the x-axis) for a TDC circuitry as presented herein. The simulation was performed in a circuit simulator with commercial models in a Monte-Carlo analysis for device variability. The y-axis is represented in dB. The resolution was simulated using input signals with a sinusoidal delay modulation with time. Hence, the TDC circuitry should produce a digital sinusoid at the output. The deviations of the TDC circuitry output from an ideal sampled sinusoid was identified as the TDC error. The root mean square of the TDC error was defined as the resolution. Quantization noise improvement over a single-chain TDC is shown by 601, and normalized power consumption is shown by 602. As can be seen in FIG. 6, the effective resolution improves faster than the power consumption, yielding about 4 dB resolution-to-power ratio improvement for a large number of constituent TDCs.

Figure 7:
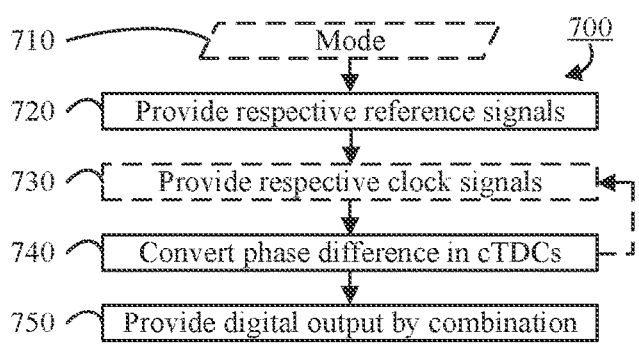
FIG. 7 is a flowchart illustrating example method steps according to some embodiments.

FIG. 7 illustrates an example method 700 according to some embodiments. The method is for converting a phase difference between an input reference signal and an input clock signal to a digitally represented output signal. The execution details of the method may be dependent on an operational mode as described above and illustrated by optional step 710.

In step 720, respective constituent reference signals are provided to each of a plurality of constituent TDCs, as described above. In optional step 730, respective constituent clock signals are provided to each of a plurality of constituent TDCs, as described above. In step 740, a phase difference between the respective constituent reference signal and the respective constituent clock signal is converted to a digitally represented constituent output signal for each of the plurality of constituent TDCs, as described above. In step 750, the digitally represented output signal is provided based on the digitally represented constituent output signals of the constituent TDCs using a digital signal combiner, as described above.

Figure 8:
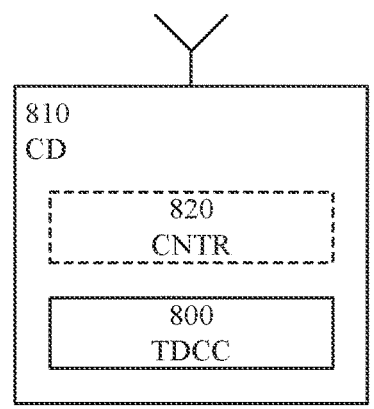
FIG. 8 is a schematic block diagram illustrating an example communication device according to some embodiments.

FIG. 8 schematically illustrates an example communication device (CD) 810 according to some embodiments. The communication device 810 may, for example, be a wireless communication device or a wired communication device. Example communication devices include a receiver, a transmitter, a transceiver, a user equipment (UE), a station (STA), and a radio access node (e.g., a base station, access point or other network node).

The communication device 810 comprises a time-to-digital converter (TDCC) 800, which may be any or the TDC circuitries described herein (e.g., any of the TDC circuitries 100 of FIG. 1 and 300 of FIG. 3). Optionally, the communication device 810 may also comprise a controller (CNTR) 820 for controlling the TDCC 800 (e.g., selecting an operational mode and/or providing time delays for the reference signal).

Generally, various embodiments present a TDC architecture that uses parallel delay-lines with random time interleaving, and wherein the output may be found by summation. High resolution can be achieved as the number of delay-lines is increased, and the circuitry is inherently linear. Small sized inverters can be used, as the architecture is based on random variations, which results in attractive power consumption for a high resolution TDC. The phase noise performance increases with targeted resolution. The circuitry of some embodiments can be re-configured between high resolution over a small range and low resolution over a wide range; possibly in several steps.

In approaches of a stochastic multiple chain TDC, several delay lines are operated in parallel (in a time interleaved fashion) to achieve high resolution. The resolution may ideally increase by a factor N, where N is the number of TDC chains (delay lines). To keep the power consumption low, the chains may use very small-sized inverter stages. The delay lines will typically be affected by random process variations and noise, and the timing between the delay lines may thus depart from ideal interleaved conditions (showing a random distribution along the delay lines).

Due to the random properties the decision points will typically be well spread out, corresponding to high time resolution, but with some loss compared to the ideal positions. Letting the initial timing of a delay line be random may ensure random time interleaving along the full delay line. A random number generator may be used to control the initial delay of the delay lines over a range of about one inverter delay. In this way, stochastic properties (i.e., resolution and linearity) may be close to identical over the full TDC range.

The output may be achieved by summation of all the TDC chain outputs (much like in a stochastic flash ADC). The individual timing position of each chain becomes unimportant, since the effective characteristic of the TDC is given by all the transition points of the inverters in all chains together.

The performance may be dependent only on the uniformity of the distribution of those transition points in time. The randomization may provide high linearity, using several parallel lines may provide low noise, and using several lines together may decrease the average distance to the closest decision point (i.e., provide high resolution).

In a multi-mode stochastic TDC, the multiple TDC chains may be operating in parallel as described above, or in series (e.g., during locking time of a DPLL, or when interference calls for more robustness). Some or all of the individual TDC chains can be connected in series to create a longer TDC chain that covers multiple periods of the regular CKV signal with less resolution. The division ratio of the PLL feedback could then be increased. Hence, robustness can be traded against phase noise.

The described embodiments and their equivalents may be realized in hardware. The embodiments may be performed by general purpose circuitry and/or by specialized circuitry. For example, the digital signal combiner and/or the reference signal provider may be (partly or fully) implemented using general purpose circuitry. Alternatively or additionally, the constituent TDCs and/or the digital signal combiner and/or the reference signal provider may be (partly or fully) implemented using specialized circuitry.

Examples of general purpose circuitry include digital signal processors (DSP), central processing units (CPU), co-processor units, field programmable gate arrays (FPGA) and other programmable hardware.

Examples of specialized circuitry include application specific integrated circuits (ASIC), delay elements (with fixed or variable delay), flip-flip circuitry, and switches.

The general purpose circuitry and/or the specialized circuitry may, for example, be associated with or comprised in an apparatus such as a transmitter, a receiver, a wireless communication device, or a network node.

Embodiments may appear within an electronic apparatus (such as a transmitter, a receiver, a wireless communication device, or a network node) comprising arrangements, circuitry, and/or logic according to any of the embodiments described herein. Alternatively or additionally, an electronic apparatus (such as a transmitter, a receiver, a wireless communication device, or a network node) may be configured to perform methods according to any of the embodiments described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. Time-to-digital converter (TDC) circuitry for converting a phase difference between an input reference signal and an input clock signal to a digitally represented output signal, the TDC circuitry comprising:
a plurality of constituent TDCs, wherein each constituent TDC is configured to convert a phase difference between a constituent reference signal and a constituent clock signal to a digitally represented constituent output signal;

a reference signal provider configured to provide the respective constituent reference signals to each of the constituent TDCs; and a digital signal combiner configured to provide the digitally represented output signal based on the digitally represented constituent output signals of the constituent TDCs;

wherein the TDC circuitry is configured to selectively switch between a parallel operation mode, in which the plurality of constituent TDCs operate in a parallel processing fashion using a common constituent clock signal, and at least one of a serial operation mode and one or more intermediate operation modes, the serial operation mode being a mode in which the plurality of constituent TDCs operate in a serial processing fashion and an intermediate operation modes being a mode in which two or more collections of the plurality of constituent TDCs operate in a parallel processing fashion while two or more constituent TDCs within at least one of the two or more collections operate in a serial processing fashion.

2. The TDC circuitry of claim 1, wherein the TDC circuitry comprises switch circuitry for each of least two of the constituent TDCs, the switch circuitry being configured to select, based on a mode selection signal, between supplying a common constituent clock signal to the respective constituent TDC in parallel operating mode and supplying a respectively delayed version of the input clock signal to each of multiple TDCs, in serial operation mode or intermediate operation mode.

3. The TDC circuitry of claim 1, wherein the reference signal provider is configured to provide, in parallel operation mode, a respectively delayed version of the input reference signal for each constituent TDC, at least two of the respective of the respectively delayed versions having different delays.

4. The TDC circuitry of claim 3, wherein the digital signal combiner is configured to provide, in parallel operation mode of the TDC circuitry, the digitally represented output signal by one or more of:

digital addition of two or more of the digitally represented constituent output signals;

calculation of an average value of two or more of the digitally represented constituent output signals; and determination of a median value of two, three, or more of the digitally represented constituent output signals.

5. The TDC circuitry of claim 3, wherein the reference signal provider is configured to provide, in parallel operation mode of the TDC circuitry, the respective constituent reference signals as respectively delayed versions of the input reference signal with the respective delays being stochastically generated.

6. The TDC circuitry of claim 3, wherein the reference signal provider is configured to provide, in parallel operation mode of the TDC circuitry, the respective constituent reference signals as respectively delayed versions of the input reference signal with the respective delays being randomly distributed.

7. The TDC circuitry of claim 3, wherein the reference signal provider is configured to provide, in parallel operation mode of the TDC circuitry, the respective constituent reference signals as respectively delayed versions of the input reference signal with the respective delays being distributed within a range associated with a constituent TDC resolution.

8. The TDC circuitry of claim 3, wherein the reference signal provider is configured to provide, in parallel operation mode of the TDC circuitry, the respective constituent reference signals as respectively delayed versions of the input reference signal with the respective delays being uniformly distributed.

9. The TDC circuitry of claim 1, wherein each constituent TDC comprises a plurality of delay elements arranged in sequence to successively delay the constituent clock signal, and a corresponding plurality of output ports, wherein each output port is configured to, when triggered by the constituent reference signal, provide an output of one of the delay elements as a symbol of the digitally represented constituent output signal.

10. The TDC circuitry of claim 1, wherein, in the parallel operation mode of the TDC circuitry, the TDC circuitry is configured to provide the input clock signal as the respective constituent clock signal to each of the constituent TDCs.

11. The TDC circuitry of claim 1, wherein at least some constituent TDCs are configured to provide respectively delayed versions of the input clock signal.

12. The TDC circuitry of claim 11, wherein the TDC circuitry is configured to selectively switch between parallel operating mode and serial operation mode, and wherein:

the TDC circuitry is configured to, in serial operation mode, provide the input clock signal as respective constituent clock signal to one constituent TDC and to successively provide respectively delayed versions of the input clock signal as respective constituent clock signals to the other constituent TDCs, and the digital signal combiner is configured to, in serial mode, provide the digitally represented output signal as a concatenation of the digitally represented constituent output signals of the constituent TDCs.

13. The TDC circuitry of claim 12, wherein the reference signal provider is configured to provide, in serial operation mode of the TDC circuitry, the same constituent reference signal to all of the constituent TDCs.

14. The TDC circuitry of claim 11, wherein the TDC circuitry is configured to selectively switch between parallel operating mode and at least a first intermediate operation mode, and wherein, in the first intermediate operation mode of the TDC circuitry:

each of a plurality of collections of constituent TDCs comprises serially arranged constituent TDCs;

the TDC circuitry is configured to provide the input clock signal as the respective constituent clock signal to first constituent TDCs of each collection, and to successively, within each collection, provide respectively delayed versions of the input clock signal as respective constituent clock signal to the constituent TDCs of the collection, and the digital signal combiner is configured to provide the digitally represented output signal based on concatenations of the digitally represented constituent output signals of constituent TDCs in each collection.

15. The TDC circuitry of claim 14, wherein the reference signal provider is configured to provide, in the first intermediate operation mode of the TDC circuitry and within each collection, the same constituent reference signal to all constituent TDCs within the collection.

16. A phase locked loop (PLL) circuit comprising the TDC circuitry of claim 1.

17. An analog-to-digital converter (ADC) circuit comprising the TDC circuitry of claim 1.

18. A communication device comprising the TDC circuitry of claim 1.

19. A method for converting a phase difference between an input reference signal and an input clock signal to a digitally represented output signal, the method comprising:

providing respective constituent reference signals to each of a plurality of constituent TDCs;

converting a phase difference between the respective constituent reference signal and a respective constituent clock signal to a digitally represented constituent output signal for each of the plurality of constituent TDCs;

providing the digitally represented output signal based on the digitally represented constituent output signals of the constituent TDCs using a digital signal combiner; and selectively switching between a parallel operation mode, in which the plurality of constituent TDCs operate in a parallel processing fashion using a common constituent clock signal, and at least one of a serial operation mode and one or more intermediate operation modes, the serial operation mode being a mode in which the plurality of constituent TDCs operate in a serial processing fashion and an intermediate operation modes being a mode in which two or more collections of the plurality of constituent TDCs operate in a parallel processing fashion while two or more constituent TDCs within at least one of the two or more collections operate in a serial processing fashion.

* * * * *